United States Patent [19]
Fukunaga

[11] Patent Number: 4,739,452
[45] Date of Patent: Apr. 19, 1988

[54] MOUNTING STRUCTURE FOR A PRINTED CIRCUIT BOARD

[75] Inventor: Masataka Fukunaga, Kamakura, Japan

[73] Assignee: Mitsubishi Denki Kabushiki Kaisha, Japan

[21] Appl. No.: 12,174

[22] Filed: Feb. 9, 1987

[30] Foreign Application Priority Data

Feb. 28, 1986 [JP] Japan .............................. 61-27576[U]

[51] Int. Cl.⁴ .............................................. H05K 5/02
[52] U.S. Cl. .................................... 361/399; 361/395; 361/419; 361/420
[58] Field of Search ..................... 361/380–389, 361/393–395, 397, 399, 415, 419–420, 424, 427; 211/41

[56] References Cited

U.S. PATENT DOCUMENTS 4,339,628  7/1982  Marcantonio et al. ............. 361/424
4,652,969  3/1987  Stegenga ............................ 361/384

FOREIGN PATENT DOCUMENTS 0154025  9/1983  Japan ................................. 361/395

Primary Examiner—Philip H. Leung
Assistant Examiner—Gregory D. Thompson
Attorney, Agent, or Firm—Leydig, Voit & Mayer

[57] ABSTRACT

A printed circuit board mounted in a casing together with other electronic and/or electric devices in a compact and spacing-saving manner, thereby enabling provision of a compact and small-sized casing. The printed circuit board is detachably mounted through pairs of first and second guide members on a flat mounting surface of the casing with at least one electric device disposed in and attached to the casing perpendicularly spaced from the flat mounting surface in a manner such that the printed circuit board is slidable parallel to the flat mounting surface of the casing underneath the electronic and/or electric devices to a mounted position for removal and mounting of the printed circuit board.

7 Claims, 3 Drawing Sheets

MOUNTING STRUCTURE FOR A PRINTED CIRCUIT BOARD

BACKGROUND OF THE INVENTION

1. Field of the Invention

This invention relates to a mounting structure for a printed circuit board, and more particularly, to a structure for mounting a printed circuit board in a casing together with other electronic and/or electric elements or devices.

2. Description of the Prior Art

In FIGS. 7 and 8, there is shown a casing 4 in which various electronic and electric elements or devices are housed and mounted in a conventional way. Specifically, a printed circuit board 1 having various electronic and/or electric components 2 such as, for example, IC chips disposed on its one side surface is removably mounted on a bottom portion of the casing 4 by means of a plurality of screws 3, and electronic devices such as a floppy disk drive unit 5 and an electric source 6 are mounted on opposite side walls of the casing 4, respectively.

In this case, if some of the electronic or electric components 2 fail, it is necessary to remove the printed circuit board 1 from the casing 4 for replacement or repair of the failed component. To this end, an ample working space above the printed circuit board 1 is required so that the screws 3 can be removed from the bottom of the casing 4 for removal of the printed circuit board 1 and the screws 3 can again be fastened into the casing bottom for remounting the printed circuit board 1 thereon. For this reason, the floppy disk drive unit 5 and the electric source 6 can not be mounted directly above the printed circuit board 1 but instead must be disposed at locations laterally spaced apart therefrom so as to not hinder removal and mounting operations for the printed circuit board 1. As a result, there necessarily arises a problem that a relatively large space is needed for installation of these elements within the casing 1, thus requiring that the dimensions of the casing 4 be needlessly large. In addition, for removal and mounting of the printed circuit board 1, a plurality of screws 3 must be screwed in or out, which is cumbersome and time-consuming, making replacment or repair work inefficient.

SUMMARY OF THE INVENTION

In view of the above, the present invention is intended to obviate the above-described problems of the prior art.

It is an object of the present invention to provide a novel and improved mounting structure for a printed circuit board by which a printed circuit board can be mounted in a casing together with other electronic and/or electric devices in a most compact and space-saving manner, thereby enabling provision of a compact and small-sized casing.

It is another object of the present invention to provide a mounting structure for a printed circuit board which permits easy and efficient removal and mounting of a printed circuit board.

In order to achieve the above objects, according to the present invention, there is provided a mounting structure for a printed circuit board in which a printed circuit board is detachably mounted on a flat mounting surface of a casing with at least one electric device disposed in and attached to the casing. The mounting structure comprises means for detachably mounting the printed circuit board on the flat mounting surface of the casing in a manner such that the printed circuit board is slidable along the flat mounting surface of the casing in a direction parallel to the flat mounting surface for removal and mounting thereof. The electric device can be disposed in the casing at a location spaced from the printed circuit board in a direction perpendicular to the flat mounting surface.

The means for detachably mounting the printed circuit board on the flat mounting surface of the casing comprises a first guide means fixedly secured to the flat mounting surface of the casing and second guide means provided on the printed circuit board and adapted to be engageable with the first guide means for sliding movement relative thereto along the flat mounting surface for removal and mounting of the printed circuit board.

It is preferable that the first guide means comprise a pair of first guide members fixedly disposed on the flat mounting surface of the casing in a spaced parallel relation with each other, and that the second guide means comprise a pair of second guide members provided on the printed circuit board in a spaced parallel relation with each other in a manner such that the second guide members are slidably engageable with the first guide members.

In one embodiment, the second guide members are formed separately from the printed circuit board and detachably secured thereto by fastening means.

In another embodiment, the second guide members are formed integrally with the printed circuit board.

In this case, it is preferable that the second guide members comprise the pair of opposite side edges of the printed circuit board.

Preferably, the printed circuit board has electric components mounted on the opposite surfaces thereof.

The printed circuit board may also have electric components mounted on only one-side surface thereof.

The above and other objects, features and advantages of the present invention will become apparent from the following detailed description of several presently preferred embodiments of the invention when taken in conjunction with the accompanying drawings.

DESCRIPTION OF THE PREFERRED EMBODIMENTS

Figure 7:
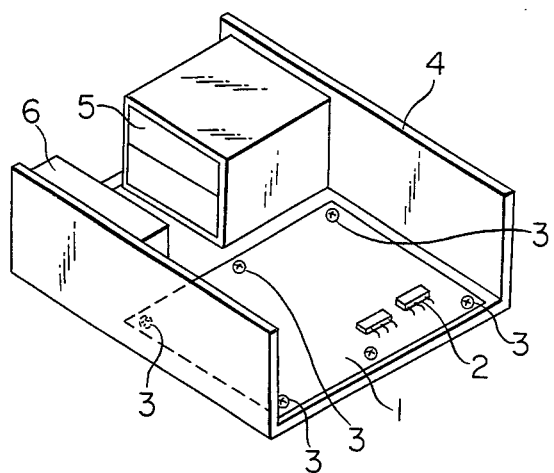
FIG. 7 is a perspective view of a casing having a printed circuit board and other electronic and/or electric elements mounted thereon.
Figure 8:
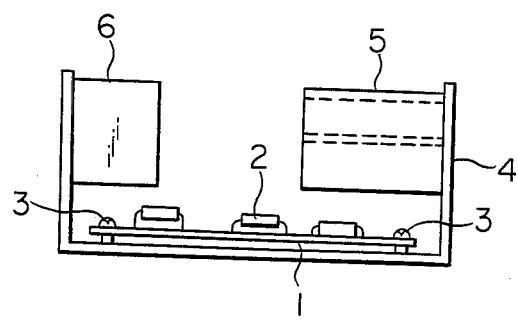
FIG. 8 is a front elevational view of the same.

The present invention will now be described in detail with reference to several presently preferred embodiments thereof as illustrated in the drawings. In the following description and the accompanying drawings, the same parts of the embodiments are identified by the same reference numerals as employed in FIGS. 7 and 8.

Figure 1:
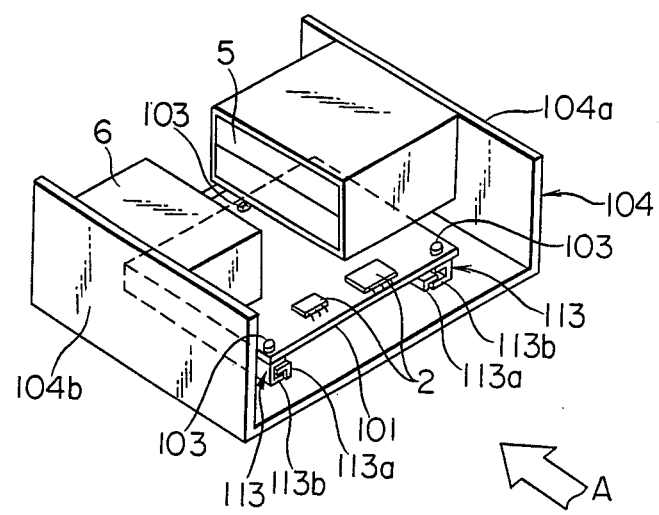
FIG. 1 is a perspective view of a casing having a printed circuit board and other electronic and/or electric elements mounted thereof.
Figure 2:
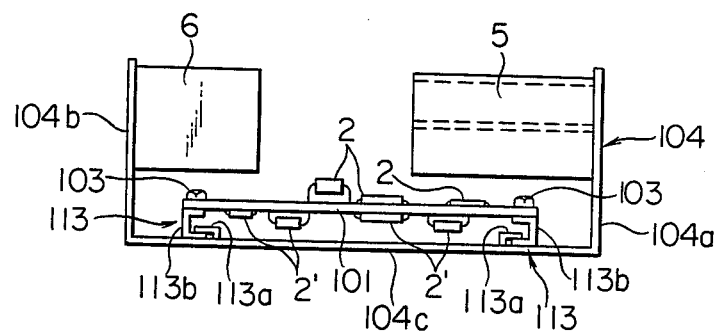
FIG. 2 is a front elevational view of the same.
Figure 3:
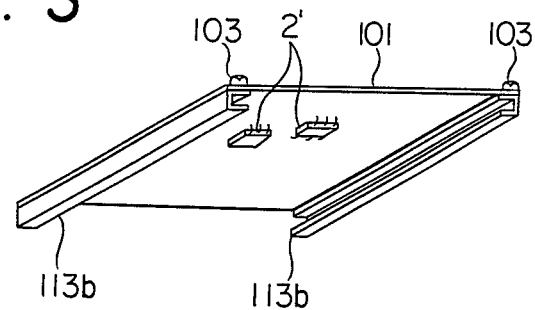
FIG. 3 is a perspective view of a printed circuit board with a part of the mounting structure attached thereto, as viewed from the backside thereof.

FIGS. 1 through 3 show a first embodiment of the present invention. Referring first to FIGS. 1 and 2, housed in a channel-shaped casing, generally designated by reference numeral 104, are a printed circuit board 101 in the form of a rectangle having various electronic components 2, 2' such as IC chips and the like mounted on the opposite surfaces thereof, and electronic and/or electric elements or devices such as a floppy disk drive unit 5 and an electric source 6. The electronic and/or electric devices 5 and 6 (hereinafter referred to as electric devices) are attached to the opposite side walls 104a, 104b of the channel-shaped casing 104 at locations just above the printed circuit board 101.

According to the present invention, the printed circuit board 101 is detachably mounted on the flat bottom portion 104c of the casing 104 through the intermediary of mounting means, which is generally designated by reference numeral 113, in a manner such that it is slidable in a direction parallel to the surface of the flat bottom portion 104c for mounting on or removal from the bottom portion 104c. More specifically, as clearly shown in FIGS. 2 and 3, the mounting means 113 comprises first guide means fixedly secured to the flat bottom portion 104c of the casing 104, and second guide means provided on the printed circuit board 101 and adapted to be engageable with the first guide means for sliding movement relative thereto along the surface of the flat bottom portion 104c.

In the embodiment illustrated in FIGS. 1 through 3, the first guide means comprises a pair of first elongated guide members 113a each in the form of an inverted L-shaped cross section having a vertical leg and a horizontal flange fixedly mounted on the flat bottom portion 104c of the casing 104 in a spaced parallel relation with each other. The first guide members 113a extending along the side walls 104a, 104b of the casing 104 substantially over the length of the printed circuit board 101. On the other hand, the second guide means comprises a pair of second elongated guide members 113b each in the form of a channel-shaped section provided on the printed circuit board 101 in a spaced parallel relation with each other. The second guide members 113b are adapted to be slidably engageable with the first guide members 113a in a manner such that they are slidable relative to the first guide members 113a along the flat surface of the casing bottom portion 104c. In this embodiment, the second guide members 113b, each having a length substantially equal to that of the printed circuit board 101, are formed separately from the printed circuit board 101 and secured to its backside or underside on the opposite sides thereof by a plurality of fastening means 103 such as set screws, rivets, welding or the like. However, it is of course possible to form the second guide members 113b integrally with the printed circuit board 101.

With the above construction, the printed circuit board 101 having various electronic and/or electric components 2, 2' (hereinafter referred to as electric components) mounted on the opposite surfaces thereof can be installed on the bottom portion 104c in an easy and efficient way simply by bringing the second guide members 113b secured to the backside thereof into engagement with the corresponding first guide members 113a on the bottom portion 104c and then forcing the second guide members 113b to slide along the first guide members 113a in a direction indicated by arrow A in FIG. 1 to an appropriate mounting position wherein the printed circuit board 101 is securely held in place by frictional engagement between the first and second guide members 113a, 113b. On the other hand, by causing the printed circuit board 101 to slide relative to the casing 104 in a direction opposite that indicated by arrow A, the printed circuit board 101 can be quite readily removed from the casing 104. Thus, if any electric component 2, 2' on the printed circuit board 101 has failed, the printed circuit board 101 can be removed from the casing 104 in the above manner whereby the failed component can be readily repaired or replaced with a new one or the printed circuit board 101 having the failed component can be entirely replaced with a new one in an easy and efficient way.

In this respect, during sliding movement of the printed circuit board 101, the second guide members 113b serve to provide a sufficient space between the printed circuit board 101 and the bottom portion 104c of the casing 104 so that the printed circuit board 101 can freely slide along the bottom portion 104c without the electric components 2, 2' on the underside of the printed circuit board 101 interfering with the bottom portion 104c. Also, the second guide members 113b act as reinforcement for the printed circuit board 101 so as to prevent flexing and/or twisting thereof.

It should be noted that due to the above-described mounting structure in which the printed circuit board 101 can be slid in a direction parallel to the surface of the flat bottom portion 104c for mounting on or removal from the casing 104, there is no need for providing any working space for the printed circuit board 101 just above the mounting position thereof so that the electric devices 5 and 6 can be disposed at locations just above the printed circuit board 101 mounted on the bottom portion 104c.

Although in the above-described embodiment, two pairs of first and second guide members 113a and 113b are provided on the opposite sides of the printed circuit board 101, the number in pairs of these guide members is not limited to two, but instead one or more additional pairs of first and second guide members 113a and 113b may provide intermediate guides at locations between the opposite sides of the the printed circuit board 101 as required.

Figure 4:
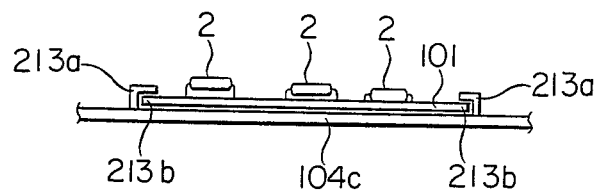
FIG. 4 is a front elevational view of another form of a mounting structure in accordance with the present invention.

FIG. 4 shows a modified form of a mounting structure for a printed circuit board in accordance with the present invention. In this modification, a printed circuit board 101 having various electric components 2 mounted on its upper side is detachably mounted by mounting means on the bottom portion 104c in a manner such that it is slidable relative to the bottom portion 104c in a direction parallel to the flat surface of the bottom portion 104c. The mounting means comprises a pair of first guide members 213a each in the form of an inverted L-shaped cross section which are fixedly mounted on the bottom portion 104c in a spaced parallel relation with other, and a pair of second guide members 213b which are constituted by the parallel side edges of the printed circuit board 101. The side edges 213b of the printed circuit board 101 are slidably engageable with the inverted L-shaped guide members 213a.

Figure 5:
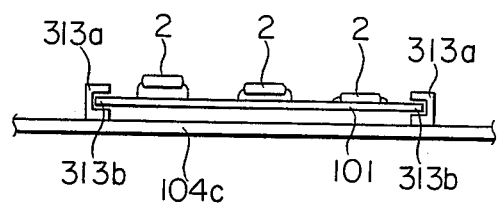
FIG. 5 is a view similar to FIG. 4, showing a further modified form of a mounting structure in accordance with the present invention.

FIG. 5 shows another modified form of a mounting structure for a printed circuit board in accordance with the present invention. In this modification, mounting means for detachably mounting a printed circuit board 101 on the bottom portion 104c comprises a pair of first guide members 313a each in the form of a channel-shaped cross section which are fixedly mounted on the bottom portion 104c in a spaced parallel relation with other, and a pair of second guide members 313b which are constituted by the parallel side edges of the printed circuit board 101.

Figure 6:
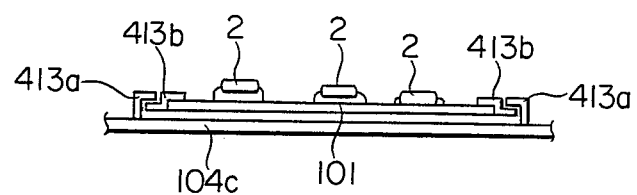
FIG. 6 is a view similar to FIG. 4, showing a still further modified form of a mounting structure in accordance with the present invention.

FIG. 6 shows a further modified form of a mounting structure for a printed circuit board in accordance with the present invention. In this modification, mounting means for detachably mounting a printed circuit board 101 on the bottom portion 104c comprises a pair of first guide members 413a each in the form of an inverted L-shaped cross section which are fixedly mounted on the bottom portion 104c in a spaced parallel relation with other, and a pair of second guide members 413b each in the form of a Z-shaped cross section which are secured by appropriate fastening means (not shown) to the parallel side edges of the printed circuit board 101. The Z shaped guide members 413b are slidably engageable with the inverted L-shaped guide members 213a.

In these modifications illustrated in FIGS. 4 through 6, the constructions and operations other than the above are substantially similar to those in the first-mentioned embodiment illustrated in FIGS. 1 through 3.

Although in the above-described embodiments, the first and second guide members 113a and 113b are formed of continuously extending elongated members, one or both of them may also be discontinuous. Thus, for example, a plurality of first and second guide members each having a limited length may be discontinuous provided on the opposite sides of the printed circuit board 101. One or more additional pairs of first and second guide members may be disposed between the front and rear ends of the board 101. Moreover, the cross sectional shape of each of the first and second guide members is not limited to those shown in FIGS. 1 through 6, but may be any other appropriate configuration such as, for example, a Z shape.

In addition, the present invention is not limited to a mounting structure for a printed circuit board but may be likewise applicable to a mounting structure for other electric elements.

As described in the foregoing, the present invention provides the following advantages. Specifically, a printed circuit board is detachably mounted through mounting means on a flat mounting surface of a casing in a manner such that it is slidable along the flat mounting surface of the casing in a direction parallel to the flat mounting surface for removal and mounting thereof. With such an arrangement, there is no need for providing any working space in the casing at a location just above the printed circuit board for mounting or removal thereof, so that at least one electric device can be disposed in the casing and mounting thereon at a location spaced from the printed circuit board in a direction perpendicular to the mounting surface. Accordingly, it is possible to reduce the size or dimensions of the casing to a practical extent as compared with the conventional mounting structure illustrated in FIGS. 7 and 8.

What is claimed is:
1. In combination,
a printed circuit board;
a casing having a flat mounting surface for said printed circuit board and at least one electrical device disposed in and attached to said casing at a location perpendicularly spacd from and above the mounting surface and an opening adjacent the mounting surface; and
means for guiding said circuit board through the opening and parallel to the flat mounting surface of said casing to a mounted position underneath said electrical device and for detachably mounting said printed circuit board in said casing in the mounted position;
said means for guiding and detachably mounting said mounted circuit board comprising:
first guide means including a pair of first guide members fixedly disposed on the flat mounting surface of said casing in a spaced parallel relation with each other; and
second guide means having a pair of second guide members formed separately from said printed circuit board and detachably secured thereto by fastening means in a spaced parallel relation with each other so as to be slidably engageable with said first guide members for guiding said printed circuit board through the opening in said casing to the mounted position for removal and mounting of said printed circuit board.

2. The combination of claim 1, said first guide members having an inverted L-shaped cross section and being fixedly secured to the flat mounting surface in a spaced parallel relation with each other and having flanges, said second guide members cooperating with said flanges of said first guide members for slidably guiding said printed circuit board for removal and mounting thereof.

3. The combination of claim 1, said first guide members comprising continuous members fixedly secured to the flat mounting surface in a spaced parallel relation with each other and having flanges, said second guide members cooperating with said flanges of said first guide members for slidably guiding said printed circuit board for removal and mounting thereof.

4. The combination of claim 1, said first guide members having flanges spaced perpendicularly from and extending parallel to the mounting surface, and said second guide members cooperating with said flanges of said first guide members for slidably guiding said printed circuit board for removal and mounting thereof.

5. The combination of claim 1, said first guide members comprising discontinuous members fixedly secured to the flat mounting surface in a spaced parallel relation with each other and having flanges, said second guide members cooperating with said flanges of said first guide members for slidably guiding said printed circuit board for removal and mounting thereof.

6. The combination of claim 1, said first guide members having a channel-shaped cross section and being fixedly secured to the flat mounting surface in a spaced parallel relation with each other, and said second guide members cooperating with said channel-shaped first guide members for slidably guiding said printed circuit board for removal and mounting thereof.

7. The combination of claim 1, said second guide members having an inverted Z-shaped cross section and being secured to the printed circuit board in a spaced parallel relation with each other, said second guide members cooperating with said first guide members for slidably guiding said printed circuit board for removal and mounting thereof.

* * * * *